(12) United States Patent
Liao et al.

(10) Patent No.: US 11,703,244 B2
(45) Date of Patent: Jul. 18, 2023

(54) TESTING APPARATUS

(71) Applicants: Global Unichip Corporation, Hsinchu (TW); Taiwan Semiconductor Manufacturing Company, Ltd., Hsinchu (TW)

(72) Inventors: Chih-Chieh Liao, Hsinchu (TW); Yu-Min Sun, Hsinchu (TW); Chih-Feng Cheng, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 459 days.

(21) Appl. No.: 17/117,139

(22) Filed: Dec. 10, 2020

(65) Prior Publication Data
US 2022/0136724 A1    May 5, 2022

(30) Foreign Application Priority Data

Nov. 3, 2020   (TW) ................................ 109138170

(51) Int. Cl.
*G01R 31/28* (2006.01)
*F24F 11/48* (2018.01)

(52) U.S. Cl.
CPC .......... *F24F 11/48* (2018.01); *G01R 31/2875* (2013.01)

(58) Field of Classification Search
CPC ............ G01R 31/2874; G01R 31/2875; G01R 31/2877
See application file for complete search history.

(56) References Cited

U.S. PATENT DOCUMENTS

| 2018/0231582 | A1 | 8/2018 | Sakai et al. | |
| 2019/0041454 | A1* | 2/2019 | Akiyama | ........... G01R 31/2881 |
| 2021/0255233 | A1* | 8/2021 | Konishi | ............. G01R 1/07314 |

FOREIGN PATENT DOCUMENTS

| CN | 108987299 | 12/2018 |
| TW | 200714857 | 4/2007 |
| TW | M462939 | 10/2013 |
| WO | 2013015355 | 1/2013 |

OTHER PUBLICATIONS

"Office Action of Taiwan Counterpart Application", dated May 31, 2021, p. 1-p. 7.

* cited by examiner

*Primary Examiner* — Tung X Nguyen
(74) *Attorney, Agent, or Firm* — JCIPRNET

(57) ABSTRACT

A testing apparatus including a base and a preheating unit arranged on the base is provided. The preheating unit includes a gas generator, a blocking mechanism and a heating device. The gas generator is configured to discharge air toward the base to form an air wall. The blocking mechanism is located above the air wall and forms a heat preservation space with the air wall. The heating device is arranged in the heat preservation space.

17 Claims, 3 Drawing Sheets

TESTING APPARATUS

CROSS-REFERENCE TO RELATED APPLICATION

This application claims the priority benefit of Taiwan application serial no. 109138170, filed on Nov. 3, 2020. The entirety of the above-mentioned patent application is hereby incorporated by reference herein and made a part of this specification.

BACKGROUND

Technical Field

The disclosure relates to a testing apparatus, and particularly relates to a testing apparatus with an air wall.

Description of Related Art

Generally speaking, chips will be placed in a testing apparatus, such as a handler, for performing the final test (FT) on the chips, and preheating is often required according to the test temperature condition before the test is carried out. Furthermore, since the testing apparatus is preheated in an open environment, the heat may be easily dissipated, resulting in that the preheated chips cannot achieve favorable temperature stability.

Some tests (such as electrical test) are more sensitive to temperature so poor temperature stability may easily affect the test result, which consequently affects the yield.

SUMMARY

The disclosure provides a testing apparatus, which enables the preheated chip to achieve favorable temperature stability, thereby improving the yield.

A testing apparatus according to an exemplary embodiment of the disclosure includes a base and a preheating unit arranged on the base. The preheating unit includes a gas generator, a blocking mechanism and a heating device. The gas generator is configured to discharge air toward the base to form an air wall. The blocking mechanism is located above the air wall and forms a heat preservation space with the air wall. The heating device is arranged in the heat preservation space.

A testing apparatus according to an exemplary embodiment of the disclosure is configured to inspect a chip. The testing apparatus includes a first work station, a second work station, and a third work station. The second work station includes a preheating unit. The preheating unit includes a gas generator, a blocking mechanism, and a heating device. The gas generator is configured to discharge air toward a base to form an air wall. The blocking mechanism is located above the air wall and forms a heat preservation space with the air wall. The heating device is arranged in the heat preservation space. The second work station connects the first work station and the third work station. The chip is transported from the first work station to the second work station to be preheated, and the chip is transported from the second work station to the third work station to be tested.

Based on the above, the preheating unit of the testing apparatus according to the disclosure forms the air wall with the gas generator, and the air wall and the blocking mechanism form the heat preservation space that is an approximately closed environment. Therefore, the heat dissipation of the heating device can be effectively reduced for the preheated chip to achieve favorable temperature stability, thereby improving the yield. In addition, with the design of the air wall, the testing apparatus can freely transport the chip under effective heat preservation, which allows the chip to freely enter and exit the first, second, and third work stations to be preheated and tested, thereby improving the practicability.

In order to make the above more comprehensible, the following exemplary embodiments will be described in detail with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

It should be noted that FIG. 2 is provided simply for clearly illustrating the approximately closed environment of the second work station, and therefore the internal components of the second work station and other work stations and components are omitted. In addition, FIG. 3 is presented in a perspective manner in order to clearly show the holes 1241.

DETAILED DESCRIPTION OF DISCLOSED EMBODIMENTS

Figure 1:
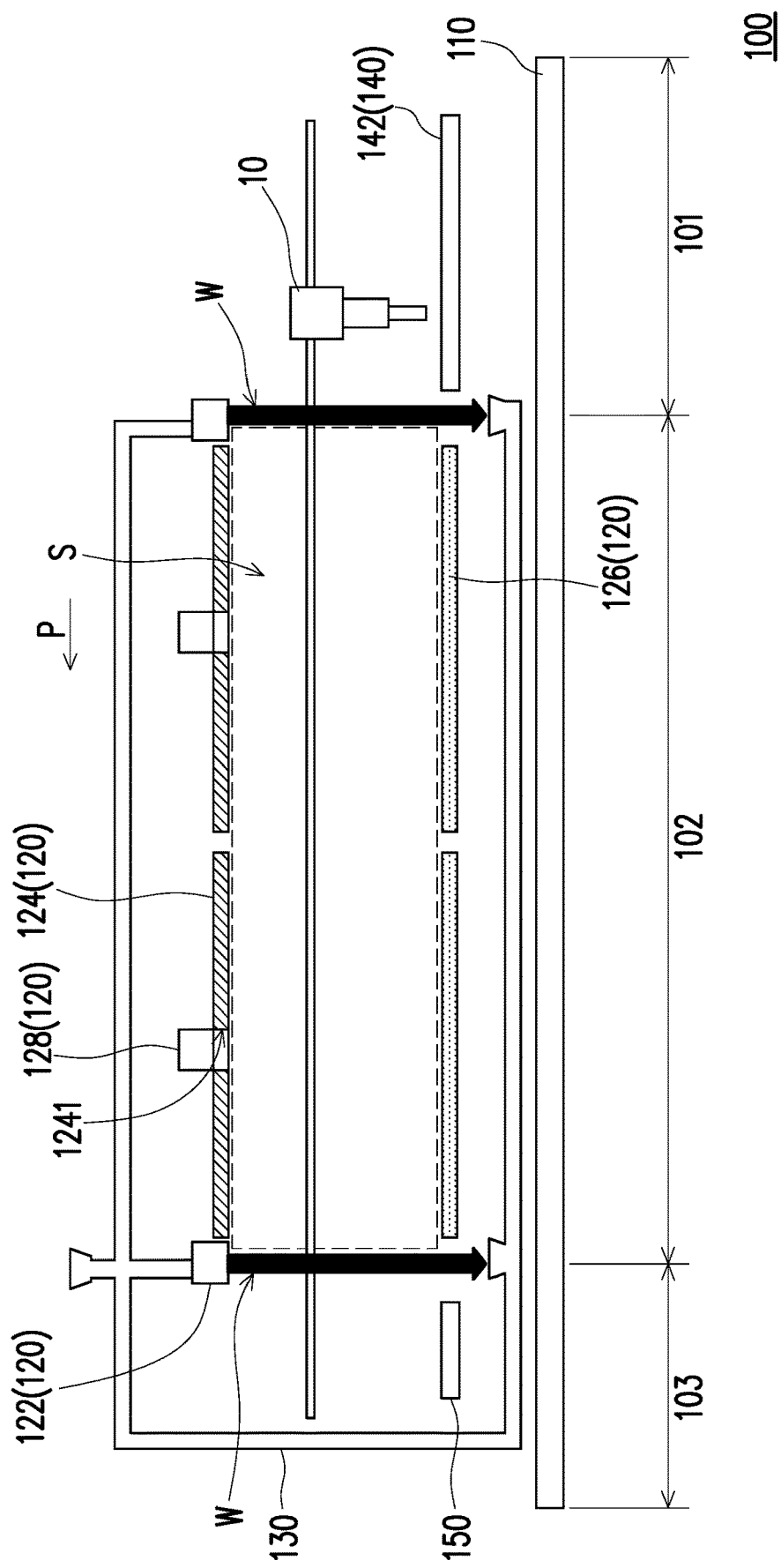
FIG. 1 is a partial side view of a testing apparatus according to an embodiment of the disclosure.

The directional terms used herein (such as up, down, right, left, front, back, top, and bottom) are illustrative with reference to the accompanying drawings and are not intended to imply the absolute orientation of the disclosure.

The disclosure will be described more fully with reference to the drawings of the embodiments. However, the disclosure can be embodied in various forms and should not be construed as being limited to the embodiments described herein. The thickness, dimensions, or size of the layer or region in the drawings may be exaggerated for clarity. The same or similar reference numerals indicate the same or similar elements, and detailed description thereof will not be repeated in the following paragraphs.

Figure 2:
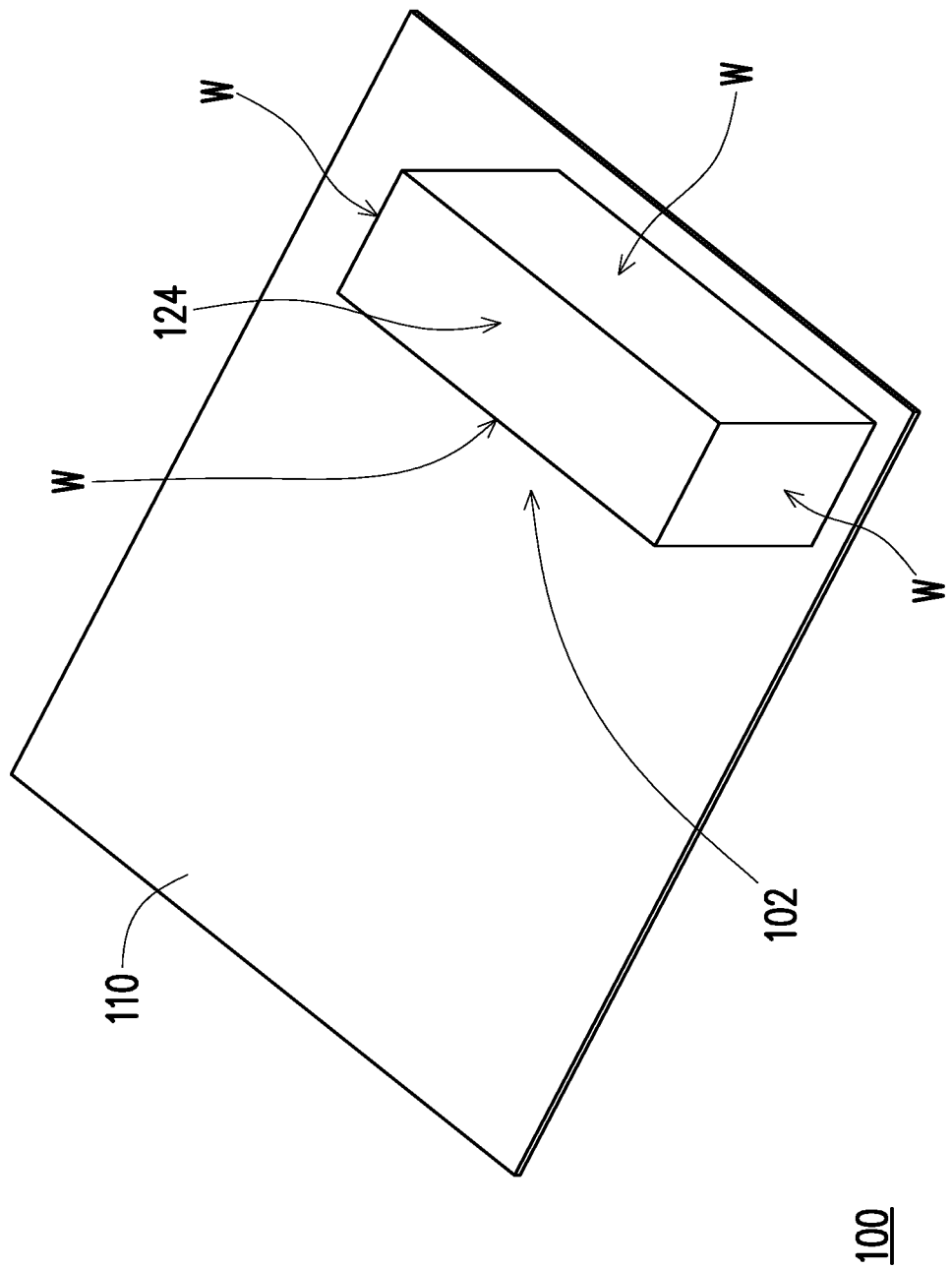
FIG. 2 is a partial perspective view of a testing apparatus according to an embodiment of the disclosure.
Figure 3:
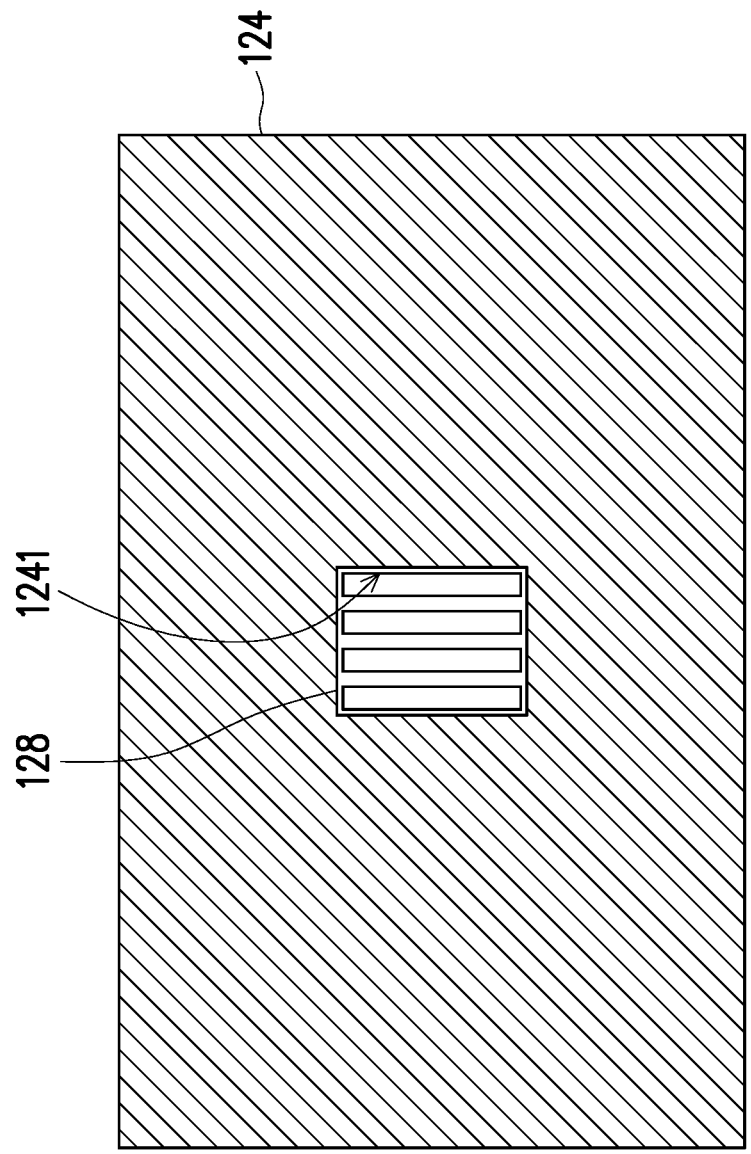
FIG. 3 is a partial top view of a blocking mechanism of a testing apparatus according to an embodiment of the disclosure.

FIG. 1 is a partial side view of a testing apparatus according to an embodiment of the disclosure. FIG. 2 is a partial perspective view of a testing apparatus according to an embodiment of the disclosure. FIG. 3 is a partial top view of a blocking mechanism of a testing apparatus according to an embodiment of the disclosure.

Referring to FIG. 1 to FIG. 3, the testing apparatus 100 of this embodiment may be used to inspect a chip (not shown), wherein the chip may be any suitable chip and is not particularly limited in the disclosure. Here, the aforementioned inspection may be, for example, an inspection required in the final test (FT) of the chip, but the disclosure is not limited thereto.

The testing apparatus 100 includes a base 110 and a preheating unit 120 arranged on the base 110 for preheating the chip during the inspection process. Further, the preheating unit 120 includes a gas generator 122, a blocking mechanism 124 and a heating device 126. The gas generator 122 is configured to discharge air toward the base 110 to form an air wall W. The blocking mechanism 124 is located above the air wall W and forms a heat preservation space S with the air wall W. The heating device 126 is arranged in the heat preservation space S.

In this embodiment, the preheating unit 120 of the testing apparatus 100 forms the air wall W with the gas generator 122, and the air wall W and the blocking mechanism 124 constitute the heat preservation space S that is an approximately closed environment. Therefore, the heat dissipation of the heating device 126 can be effectively reduced for the preheated chip to achieve favorable temperature stability, thereby improving the yield.

Furthermore, the air wall W may be an invisible wall formed around the heating device 126 to prevent cold air outside the air wall W from entering the heat preservation space S. That is to say, the air wall W has the blocking effect of a wall but does not have physical structural restrictions. The blocking mechanism 124 above may be regarded as a top cover structure, so that the air wall W and the blocking mechanism 124 form an invisible chamber, as shown in FIG. 2. Therefore, the heat preservation space S formed by the air wall W and the blocking mechanism 124 can effectively reduce the heat dissipation of the heating device 126 for the preheated chip to achieve favorable temperature stability, thereby improving the yield.

In addition, the testing apparatus 100 includes a first work station 101, a second work station 102, and a third work station 103, wherein the second work station 102 may include the preheating unit 120. Furthermore, the second work station 102 may connect the first work station 101 and the third work station 103. In other words, the second work station 102 may be located between the first work station 101 and the third work station 103.

In this embodiment, the chip may be transported from the first work station 101 to the second work station 102 to be preheated, and the chip may be transported from the second work station 102 to the third work station 103 to be tested, as indicated by the transport path P in FIG. 1. Therefore, with the design of the air wall W, the testing apparatus 100 can freely transport the chip under effective heat preservation, which allows the chip to freely enter and exit the first work station 101, the second work station 102, and the third work station 103 to be preheated and tested, thereby improving the practicability.

For example, with the design of the air wall W, the testing apparatus 100 allows a robotic arm 10 that transports the chip to freely enter and exit the first work station 101, the second work station 102, and the third work station 103 under effective heat preservation for the chip to be preheated and tested. Since the air wall W and the blocking mechanism 124 form an invisible chamber, the robotic arm 10 is not restricted by a physical structure. Nevertheless, the disclosure is not limited thereto.

In some embodiments, in order to prevent the turbulence generated at the bottom of the air wall W from disturbing the temperature stability of the chip, the testing apparatus 100 further includes a circulation piping 130 for receiving the exhaust gas of the gas generator 122 and returning the exhaust gas to the gas generator 122 as a gas source of the gas generator 122, but the disclosure is not limited thereto.

In some embodiments, the exhaust gas of the gas generator 122 comes from, for example, the air discharged for forming the air wall W, which absorbs the waste heat of the machine and thus has a temperature higher than the room temperature. Therefore, by returning the exhaust gas having a higher temperature, the heat loss in the heat preservation space S can be further reduced to achieve the effect of energy saving. Nevertheless, the disclosure is not limited thereto.

In this embodiment, the first work station 101 is used to provide the chip, and the third work station 103 is used to test the chip. Therefore, the first work station 101 may include a loading unit 140, and the third work station 103 may include a testing unit 150. Specifically, the loading unit 140 is arranged on the base 110 and connected to the preheating unit 120, and the testing unit 150 is arranged on the base 110 and connected to a side of the preheating unit 120 opposite to the loading unit 140. In other words, the loading unit 140 and the testing unit 150 may be located on opposite sides of the preheating unit 120.

In some embodiments, the first work station 101 has a tray 142 for carrying the chip to be tested, so that the robotic arm 10 can grab the chip on the tray 142 and transport the chip to the second work station 102, but the disclosure is not limited thereto.

In some embodiments, with the design of the invisible air wall W, the loading unit 140 of the first work station 101, the preheating unit 120 of the second work station 102, and the testing unit 150 of the third work station 103 have a communication space separated by the air wall W. Therefore, the chip can freely enter and exit the communication space under effective heat preservation, which improves the practicability of the testing apparatus. Nevertheless, the disclosure is not limited thereto.

Furthermore, the aforementioned communication space may have different ambient temperatures. In some embodiments, the ambient temperature of the preheating unit 120 (second work station 102) is greater than the ambient temperature of the testing unit 150 (third work station 103) and the ambient temperature of the loading unit 140 (first work station 101), but the disclosure is not limited thereto.

In some embodiments, the ambient temperature of the preheating unit 120 is at least greater than 70° C. That is, the ambient temperature inside the air wall W may be greater than the ambient temperature outside the air wall W to ensure that the chip has favorable temperature stability, but the disclosure is not limited thereto.

In some embodiments, the heating device 126 is a heating plate for carrying and heating the chip transported by the robotic arm 10. Therefore, the heating device 126 heats the chip by heat conduction, for example. Nevertheless, the disclosure is not limited thereto. The heating device 126 may use any suitable heating method to heat the chip.

In some embodiments, the blocking mechanism 124 includes a heat radiation mirror. Therefore, the heat radiation lost by the heating device 126 can be reflected back to the chip by the heat radiation mirror to recycle the heat radiation and achieve the effect of energy saving, but the disclosure is not limited thereto.

In some embodiments, the preheating unit 120 further includes a windless ion fan 128. The windless ion fan 128 may be arranged on the blocking mechanism 124 and located outside the heat preservation space S, and the blocking mechanism 124 may have a plurality of holes 1241 arranged in an array (as shown in FIG. 3), which allow the ions generated by the windless ion fan 128 to pass through, so as to eliminate static electricity and reduce the cooling effect caused by blowing of the ion fan during the preheating of the chip, thereby achieving favorable temperature stability. Nevertheless, the disclosure is not limited thereto. In some other embodiments, the preheating unit 120 may also be a wind ion fan.

It should be noted that FIG. 1 only schematically illustrates the loading unit 140 of the first work station 101, the preheating unit 120 of the second work station 102, and the testing unit 150 of the third work station 103. The loading unit 140 of the first work station 101, the preheating unit 120 of the second work station 102, and the testing unit 150 of the third work station 103 are not limited to the parts shown in FIG. 1, and can be adjusted according to actual design requirements.

In addition, FIG. 1 only schematically illustrates the relationship between the loading unit 140, the preheating unit 120, and the testing unit 150. The loading unit 140, the preheating unit 120, and the testing unit 150 can be connected in any suitable manner, which is not particularly limited in the disclosure. Furthermore, the testing apparatus 100 can be adjusted to further include other unillustrated work stations according to actual design requirements, and the disclosure is not limited to the aforementioned work stations.

In summary, the preheating unit of the testing apparatus according to the disclosure forms the air wall with the gas generator, and the air wall and the blocking mechanism form the heat preservation space that is an approximately closed environment. Therefore, the heat dissipation of the heating device can be effectively reduced for the preheated chip to achieve favorable temperature stability, thereby improving the yield. In addition, with the design of the air wall, the testing apparatus can freely transport the chip under effective heat preservation, which allows the chip to freely enter and exit the first, second, and third work stations to be preheated and tested, thereby improving the practicability.

Although the disclosure has been described with reference to the above embodiments, they are not intended to limit the disclosure. It will be apparent to those skilled in the art that various modifications and variations can be made to the disclosure without departing from the scope or spirit of the disclosure. In view of the foregoing, it is intended that the disclosure covers modifications and variations provided they fall within the scope of the following claims and their equivalents.

What is claimed is:

1. A testing apparatus, comprising:
   a base; and
   a preheating unit arranged on the base, wherein the preheating unit comprises:
      a gas generator discharging air toward the base to form an air wall;
      a blocking mechanism located above the air wall and forming a heat preservation space with the air wall; and
      a heating device arranged in the heat preservation space.

2. The testing apparatus according to claim 1, further comprising a circulation pipeline which receives exhaust gas of the gas generator and returns the exhaust gas to the gas generator as a gas source of the gas generator.

3. The testing apparatus according to claim 1, further comprising a loading unit which is arranged on the base and connected to the preheating unit, wherein the loading unit and the preheating unit have a first communication space separated by the air wall.

4. The testing apparatus according to claim 3, further comprising a testing unit which is arranged on the base and connected to a side of the preheating unit opposite to the loading unit, wherein the loading unit, the preheating unit, and the testing unit have a second communication space separated by the air wall.

5. The testing apparatus according to claim 4, wherein an ambient temperature of the preheating unit is greater than an ambient temperature of the testing unit and an ambient temperature of the loading unit.

6. The testing apparatus according to claim 5, wherein the ambient temperature of the preheating unit is at least greater than 70° C.

7. The testing apparatus according to claim 1, wherein the heating device is a heating plate.

8. The testing apparatus according to claim 1, wherein the blocking mechanism comprises a heat radiation mirror.

9. The testing apparatus according to claim 1, wherein the preheating unit further comprises a windless ion fan which is arranged on the blocking mechanism and located outside the heat preservation space, and the blocking mechanism has a plurality of holes arranged in an array, which allow ions generated by the windless ion fan to pass through.

10. A testing apparatus for inspecting a chip, the testing apparatus comprising:
    a first work station;
    a second work station comprising a preheating unit, wherein the preheating unit comprises:
       a gas generator discharging air to form an air wall around the first work station;
       a blocking mechanism located above the air wall and forming a heat preservation space with the air wall; and
       a heating device arranged in the heat preservation space; and
    a third work station, wherein the second work station connects the first work station and the third work station, the chip is transported from the first work station to the second work station to be preheated, and the chip is transported from the second work station to the third work station to be tested.

11. The testing apparatus according to claim 10, further comprising a circulation pipeline which receives exhaust gas of the gas generator and returns the exhaust gas to the gas generator as a gas source of the gas generator.

12. The testing apparatus according to claim 10, wherein the first work station, the second work station, and the third work station have a communication space separated by the air wall.

13. The testing apparatus according to claim 12, wherein the communication space has different ambient temperatures.

14. The testing apparatus according to claim 13, wherein an ambient temperature of the second work station is greater than an ambient temperature of the first work station and the third work station.

15. The testing apparatus according to claim 10, wherein the heating device is a heating plate.

16. The testing apparatus according to claim 10, wherein the blocking mechanism comprises a heat radiation mirror.

17. The testing apparatus according to claim 10, wherein the preheating unit further comprises a windless ion fan which is arranged on the blocking mechanism and located outside the heat preservation space, and the blocking mechanism has a plurality of holes arranged in an array, which allow ions generated by the windless ion fan to pass through.

\* \* \* \* \*